United States Patent
Shih et al.

(10) Patent No.: US 6,726,535 B2
(45) Date of Patent: Apr. 27, 2004

(54) METHOD FOR PREVENTING LOCALIZED CU CORROSION DURING CMP

(75) Inventors: Tsu Shih, Hsin-Chu (TW); Kuan-Ku Hung, Changhua (TW); Chen-Hua Yu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 171 days.

(21) Appl. No.: 10/132,442

(22) Filed: Apr. 25, 2002

(65) Prior Publication Data

US 2003/0203706 A1 Oct. 30, 2003

(51) Int. Cl.$^7$ ................................................ B24B 7/22
(52) U.S. Cl. ......................................... 451/37; 451/57
(58) Field of Search .............................. 451/37, 36, 41, 451/57; 438/692, 693, 694, 750, 754; 216/88, 89, 105; 134/1.3

(56) References Cited

U.S. PATENT DOCUMENTS 6,261,158 B1 * 7/2001 Holland et al. ............... 451/63
6,274,478 B1 * 8/2001 Farkas et al. ................ 438/626
6,432,826 B1 * 8/2002 Emami et al. ............... 438/692
6,620,027 B2 * 9/2003 Sutshi et al. .................. 451/5
2002/0093002 A1 * 7/2002 Tsuchiya et al. ............ 252/79.1

* cited by examiner

Primary Examiner—Robert A. Rose
(74) Attorney, Agent, or Firm—Tung & Associates

(57) ABSTRACT

A method for preventing or reducing corrosion of copper containing features included in a semiconductor wafer in a chemical mechanical polishing (CMP) process including providing a semiconductor wafer polishing surface including copper filled anisotropically etched features; polishing the semiconductor wafer polishing surface according to a first CMP process including applying at least one polishing slurry to contact the semiconductor wafer polishing surface for removing an uppermost layer of the semiconductor wafer polishing surface; and, alternately applying a copper corrosion inhibitor solution for a period of time and the at least one polishing slurry for a period of time to contact the semiconductor wafer polishing surface to comprise a polishing cycle said polishing cycle performed at least once during at least a second CMP process.

20 Claims, 2 Drawing Sheets

METHOD FOR PREVENTING LOCALIZED CU CORROSION DURING CMP

FIELD OF THE INVENTION

This invention generally relates to chemical mechanical polishing (CMP) and more particularly to a method for preventing localized copper (Cu) anodic corrosion in a chemical mechanical polishing (CMP) process.

BACKGROUND OF THE INVENTION

In semiconductor fabrication integrated circuits and semiconducting devices are formed by sequentially forming features in sequential layers of material in a bottom-up manufacturing method. The manufacturing process utilizes a wide variety of deposition techniques to form the various layered features including various etching techniques such as anisotropic plasma etching to form device feature openings followed by deposition techniques to fill the device features. In order to form reliable devices, close tolerances are required in forming features including photolithographic patterning methods which rely heavily on layer planarization techniques to maintain a proper depth of focus.

Planarization is increasingly important in semiconductor manufacturing techniques. As device sizes decrease, the importance of achieving high resolution features through photolithographic processes correspondingly increases thereby placing more severe constraints on the degree of planarity required of a semiconductor wafer processing surface. Excessive degrees of surface nonplanarity will undesirably affect the quality of several semiconductor manufacturing process including, for example, in a photolithographic process, the positioning the image plane of the process surface within an increasingly limited depth of focus window to achieve high resolution semiconductor feature patterns.

In the formation of conductive interconnections, copper is increasingly used for forming metal interconnects such as vias and trench lines since copper has low resistivity. The undesirable contribution to electrical parasitic effects by metal interconnect residual resistivity has become increasingly important as device sizes have decreased.

One planarization process is chemical mechanical polishing (CMP). CMP is increasingly being used as a planarizing process for semiconductor device layers, especially for applications with smaller semiconductor fabrication processes, for example, below about 0.25 micron. CMP planarization is typically used several different times in the manufacture of a multi-layer semiconductor device, including planarizing a layered device structure in a multi-layer device for subsequent processing of overlying layers. For example, CMP is used to remove excess metal after filling conductive metal interconnects such as vias and trench lines with metal, for example copper, to electrically interconnect the several layers and areas that make up a multi-layer semiconductor device.

In a typical process for forming conductive interconnections in a multi-layer semiconductor device, a damascene process is used to form vias and trench lines for interconnecting different layers and areas of the multilayer device. Vias (e.g., V1, V2 etc. lines) are generally used for vertically electrically interconnecting semiconductor device layers and trench lines (e.g., M1, M2, etc. lines) are used for electrically interconnecting semiconductor device areas within a layer. Vias and trench lines are typically formed as part of a damascene process. Although there are several different methods for forming damascene structures, one typical method generally involves patterning and anisotropically etching a semiconductor feature, for example a via opening within an insulating dielectric layer to make closed communication contact with a conductive area within an underlying layer of the multilayer device. A similar process is then used to pattern and anisotropically etch a trench line opening overlying and encompassing the via opening to form a dual damascene structure. The dual damascene structure is then filled with a metal, for example copper followed by a CMP step to remove excess metal overlying the insulating layer dielectric (ILD) surface and to planarized the ILD surface for a subsequent processing step. The process is then repeated in an overlying ILD layer to form a series of stacked conductive lines which electrically communicate between and within the various layers to form a multi-layered semiconductor device. Typically, vias and dual damascene structures are stacked above one another to reduce an overall space requirement for patterning a semiconductor device.

CMP generally includes placing a process surface of the wafer in contact against a flat polishing surface, imparting a downforce to the wafer backside and moving the wafer and the polishing surface relative to one another. The polishing action is typically aided by a slurry which includes for example, small abrasive particles such as silica ($SiO_2$) or alumina ($Al_2O_3$) that abrasively act to remove a portion of the process surface. Additionally, the slurry may include chemicals such as complexing agents and film forming agents that react with the process surface to assist in removing a portion of the surface material, the slurry typically being introduced to contact the wafer surface and the polishing pad.

Typically CMP polishing slurries contain an abrasive material, such as silica or alumina, suspended in an aqueous medium. There are various mechanisms disclosed in the prior art by which metal surfaces can be polished with slurries. In one method, the formation of a thin oxide layer takes place in-situ by reaction between the metal surface and an oxidizing agent which simultaneously forms an oxide layer while an abrasive is removing the oxide layer. The thin abradable oxide layer including the underlying metal layer is thereby selectively removed in a controlled manner by mechanical abrasive action. The rate of material removal can be varied by adjusting the rate of oxide formation and material removal.

Several semiconductor feature defects can be associated with CMP polishing. For example, in CMP polishing metals, for example copper features included in an array of metal interconnects, the copper is removed or eroded at a faster rate than the surrounding field of insulating dielectric. This causes a topography difference between insulating dielectric and the dense copper array, typically referred to as erosion or corrosion. Such erosion (corrosion) can lead to excess removal of copper such that overlying formation of electrical interconnecting features, for example, stacked vias, leads to electrical failure by causing discontinuous electrical communication pathways.

One particular problem related to the formation of copper interconnect features such as copper filled vias and trenches is the practice of forming a conformal barrier/adhesion layer within the anisotropically etched features prior to filling with copper. The barrier/adhesion layer is typically a refractory metal such as tantalum nitride (TaN) formed to prevent diffusion of copper into the porous insulating dielectric layer (ILD) within which the via and trench openings are formed. After filling of the interconnect features with copper, for example by electroplating, a CMP process is carried out to first remove the excess copper overlying the barrier/adhesion layer and another CMP process performed to remove the barrier/adhesion layer overlying the insulating (ILD) layer. During a portion of the CMP processes positively and negatively charges species present in the polishing slurry act as an electrolyte in contact with two dissimilar metals, for example tantalum and copper, thereby forming a galvanic cell. Such galvanic action is believed to be at least in part responsible for copper corrosion at the surface of copper filled features that takes place in CMP processes where both the barrier/adhesion layer and copper features are being polished.

For example, referring to FIG. 1 is shown a portion of a multi-layer structure including dual damascene structures e.g., 10, 12 and 13, 15 forming stacked dual damascene structures. The stacked dual damascene structures include a via portion e.g., 10A, 12A and a trench line portion e.g., 10B, 12B, formed in a first insulating dielectric layer (ILD) 14A and a second ILD layer 14B. After patterning and anisotropically etching the via and trench openings in ILD 14A, a barrier/adhesion layer e.g., 16A, is conformally deposited to form a thin layer to line the dual damascene structure prior to filling with copper, e.g., 18A, for example by an electrodeposition process. Following the copper filling process, a CMP process is carried out to polish back excess copper and the underlying barrier/adhesion layer formed over the ILD layer 14A surface (not shown) to planarize the ILD layer 14A prior to forming the overlying ILD layer 14B to form another overlying dual damascene structure, e.g., 12. During the CMP process, copper corrosion of the upper portion of, for example, trench line e.g., 10BA, 12B, may take place by galvanic corrosion leaving the upper portion of the trench line e.g., 10BA, 12B, devoid of copper filling e.g., as shown at e.g., 10C, 12C thereby inducing an open circuit in the electrical interconnect.

According To the prior art, several approaches have been proposed to reduce the copper corrosion action that takes place during CMP. One approach has been to add film forming agents or corrosion inhibitors to the slurry solution to inhibit the polishing of the copper surfaces. A problem with this approach is that the polishing rate of copper is frequently slowed to an excessive extent causing an undesirable increase in throughput times and slurry usage. In addition, different polishing slurries are used for polishing different layers, for example, the copper layer and the barrier/adhesion layer including, for example, a tantalum nitride layer. The optimal concentration of chemicals, for example, corrosion inhibitors, may vary depending on the density of the copper feature interconnect pattern present on the semiconductor surface. As a result, the pre-mixing of slurries becomes a complicated process in achieving optimal material removal rates and makes the avoidance of copper corrosion together with optimal material removal rates difficult to achieve in practice.

Therefore, there is a need in the semiconductor art to develop a CMP method for planarizing dielectric layers including copper semiconductor features such that the occurrence of CMP induced defects such as copper corrosion is reduced or prevented without undesirably slowing material removal rates.

It is therefore an object of the invention to provide a CMP method for planarizing dielectric layers including copper semiconductor features such that the occurrence of CMP induced defects such as copper corrosion is reduced or prevented without undesirably slowing material removal rates while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for preventing or reducing corrosion of copper containing features included in a semiconductor wafer in a chemical mechanical polishing (CMP) process.

In a first embodiment, the method includes providing a semiconductor wafer polishing surface including copper filled anisotropically etched features; polishing the semiconductor wafer polishing surface according to a first CMP process including applying at least one polishing slurry to contact the semiconductor wafer polishing surface for removing an uppermost layer of the semiconductor wafer polishing surface; and, alternately applying a copper corrosion inhibitor solution for a period of time and the at least one polishing slurry for a period of time to contact the semiconductor wafer polishing surface to comprise a polishing cycle said polishing cycle performed at least once during at least a second CMP process.

These and other embodiments, aspects and features of the invention will be better understood from a detailed description of the preferred embodiments of the invention which are further described below in conjunction with the accompanying Figures.

DESCRIPTION OF THE PREFERRED EMBODIMENTS

Although the present invention is explained with respect to implementation in the context of high density copper wiring interconnect patterns in semiconductor devices, including for example, stacked vias and dual damascene structures, it will be appreciated that the present invention is equally applicable to chemical mechanical polishing (CMP) of any copper feature included in a multi-layer semiconductor device where application of the method of the present invention may be advantageously applied to prevent CMP induced defects by galvanic corrosion of copper features including undesirable preferential polishing of copper containing features. It will be further appreciated that the method of the present invention is envisioned to be used several times in the manufacture of a multi-layer semiconductor device and that the particular semiconductor manufacturing processes set forth herein are intended to exemplify the practice of the present invention. It will be also understood that the use of the term 'copper', herein includes copper or alloys thereof.

Figure 1:
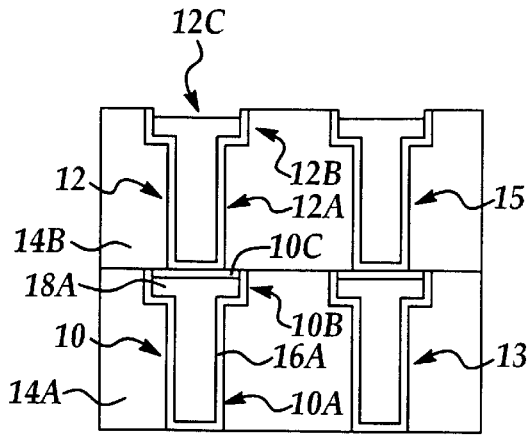
FIG. 1 is a side view representation of a portion of exemplary copper containing semiconductor features in a multi-layer semiconductor device showing the effect of copper corrosion following CMP processes according to the prior art.
Figure 2A:
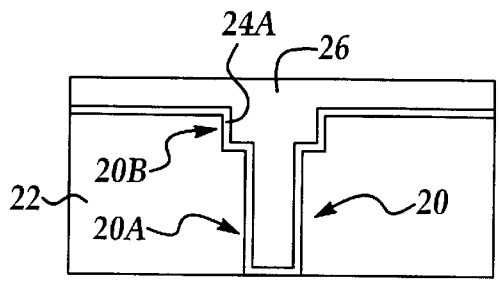
FIGS. 2A to 2D are side view representations of an exemplary copper containing semiconductor feature at different stages of manufacture including the CMP process according to embodiments of the present invention.

In an exemplary process, for example, referring to FIG. 2A, is shown a portion of a semiconductor wafer including a side view representation of a portion of a multi-layer semiconductor device having an anisotropically etched dual damascene structure 20 with a via portion 20A and an overlying trench line portion 20B. While there are several ways to form a dual damascene structure, one approach involves at least two photolithographic patterning and anisotropic etching steps to first form via openings followed by a similar process to form overlying trench line openings. The dual damascene structures e.g., 20 are formed by anisotropically etching the via and trench line features in an insulating layer e.g., 22, for example, a low dielectric constant doped oxide formed by plasma enhanced CVD (PECVD). A barrier/adhesion layer 24A of, for example, TaN nitride, is conformally deposited to include covering the sidewalls and bottom portion of the etched via feature 20A and sidewalls of the trench line feature 20B. The barrier/adhesion layer 24A serves the purpose of preventing copper diffusion into the surrounding insulating layer 22 and improving adhesion of subsequently deposited copper to fill the dual damascene structure.

Following deposition of barrier/adhesion layer 24A, the via openings e.g., 20A and trench openings e.g., 20B are typically filled with copper by an electrodeposition process. Although other copper filling methods may be used, electroplating (electrodeposition) is increasingly preferred because of its superior gap-filling and step coverage ability. Prior to electrodeposition, a seed layer of copper (not shown) is conformally deposited over the barrier/adhesion layer 24A by, for example PVD or CVD. The copper seed layer is preferably conformably deposited to form a continuous layer thereby providing a conductive surface for the subsequent electrodeposition process whereby an electrical potential is applied to the seed layer by cathode contacts contacting, for example, the outer peripheral edges of the semiconductor wafer.

Following deposition of the copper seed layer, a copper layer 26 is deposited to fill the via feature and trench line feature, e.g., 20A and 20B. Following the electrodeposition process, the copper layer 26 is subjected to a CMP process to remove excess copper overlying the barrier/adhesion layer 24A.

Figure 2B:
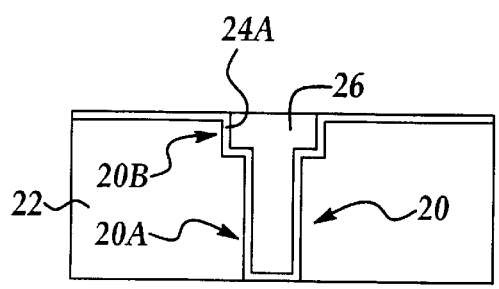

In one embodiment of the method according to the present invention, a first CMP process is first carried out to remove the excess copper layer 26 overlying the barrier/adhesion layer 24A to endpoint detection. Endpoint detection may be accomplished by any process as long as the endpoint detection process detects a point in the CMP process at which at least a substantial portion of the excess copper layer 26 overlying the adhesion/barrier layer 24A has been removed as conceptually shown in FIG. 2B. More preferably, the endpoint detection process detects a material removal point endpoint detection) at which at least a portion of the semiconductor polishing surface including the adhesion barrier layer 24A is covered with copper remaining from copper layer 26. For example, preferably, at endpoint detection there will be portions of the semiconductor process surface where the barrier/adhesion layer is exposed and portions where a copper overlayer is present. For example, there are several suitable endpoint detection processes known in the art that use real-time optical methods including wafer polishing surface reflectance measurements, as well as laser interferometry. In addition, other methods such as polishing pad motor load monitoring may be used for endpoint detection.

The first CMP process according to the present invention may be carried out by any conventional CMP process using any conventional slurry for polishing a copper feature containing semiconductor wafer surface. For example, a linear or rotary polisher may be used as is known in the art. Copper polishing slurries having at least one of silica ($SiO_2$), alumina ($Al_2O_3$), ceria ($CeO_2$), titania ($TiO_2$), and zirconia ($ZrO_2$) are typically used as abrasive agents included in polishing slurries. In addition, metal oxides suitable for use as abrasives in polishing slurries may include porous inorganic oxide gels including hydrogels, aerogels, or xerogels formed by conventional processes. Preferably, colloidal silica ($SiO_2$) having an average primary particle size of about 10 to 75 nm or alternatively, having a specific surface area of from about 30 to 300 $m^2/g$ is used as the abrasive agent. The specific surface area is typically determined by a nitrogen adsorption method (BET method) from which the average primary particle size may be estimated.

In an exemplary embodiment of the present invention, the first CMP process is carried out with a conventional copper polishing slurry for example, including an oxidizing agent such as hydrogen peroxide ($H_2O_2$) to form a copper oxide passivation layer in-situ to better control material removal rates. Other oxidizing agents may be used including compounds with a peroxy group such as peroxides and percarbonates. For example, the oxidizing agent is typically present in an amount ranging from about 0.3 to about 17.0 weight percent. The pH of the first CMP process polishing slurry for example, is typically within a range of from about 3 to about 90. Further, the copper removal rate is typically from 2000 to 10,000 Angstroms/min.

In one embodiment of the present invention, following endpoint detection in the first CMP process, the application of the copper polishing slurry to the semiconductor wafer polishing surface is stopped and a copper corrosion inhibitor is then applied to the semiconductor wafer polishing surface for a period of time included in a second CMP process. The copper corrosion inhibitor may be applied to the semiconductor wafer polishing surface by conventional methods depending on the CMP apparatus used, for example, the corrosion inhibitor may be applied by a flow or spraying process to the polishing pad where it subsequently contacts the semiconductor wafer polishing surface or it may be applied directly to the wafer polishing surface, for example through the polishing pad as is known in the art. Preferably, a continuous flow or spray of the copper corrosion inhibitor is applied to contact the semiconductor wafer polishing surface. Preferably, the copper corrosion inhibitor includes at least one of Benzotriazole (BTA), and Benzotriazole derivatives such as Triazole, and Tritriazole. BTA is preferred as it has been found to be the most effective copper corrosion inhibitor. The copper corrosion inhibitor preferably includes a mixture of BTA and deionized water including a concentration of BTA from about 0.04 wt % to about 4 wt %, more preferably about 0.1 wt %.

Preferably, during the second CMP process, the copper corrosion inhibitor solution and the copper polishing slurry are alternately independently applied to contact the semiconductor polishing surface for a period of time. For example, following endpoint detection, the application of the copper polishing slurry to contact the semiconductor wafer polishing surface is stopped and the copper corrosion inhibitor (solution) is applied to contact the semiconductor wafer polishing surface during a CMP process for a period of time and then stopped, after which the copper polishing slurry is again applied for a period of time during a CMP process to constitute a polishing cycle included in the second CMP process. For example, in one embodiment where the copper polishing slurry and copper corrosion inhibitor are alternately independently applied to contact the semiconductor wafer polishing surface, following endpoint detection, the application of the copper polishing slurry to the wafer polishing surface is stopped and the copper corrosion inhibitor is applied to the wafer polishing surface at a flow rate of from about 100 ml/min to about 500 ml/min for about 5 to about 20 seconds during a CMP process followed by stopping the application of the copper corrosion inhibitor and applying the copper polishing slurry to contact the wafer polishing surface (polishing pad) at a flow rate of from about 10 ml/min to about 500 ml/min for about 30 to about 60 seconds, to constitute a polishing cycle in the second CMP process. Typically a single polishing cycle in the second CMP process according to the present invention is sufficient to accomplish substantial removal of a remaining portion of the excess copper layer 26 overlying the adhesion/barrier layer to complete a copper overpolishing step in the second CMP process. It will be appreciated that more than one polishing cycle in the second CMP process may be performed according to the present invention to complete the copper overpolishing step (second CMP process). For example, the necessity of more than one polishing cycle in the second CMP process may depend in part on the material removal rate of the copper polishing slurry and the concentration of the corrosion inhibitor. For example, with a high copper removal rate, and a low concentration of corrosion inhibitor, several polishing cycles of alternately applying copper polishing slurry and corrosion inhibitor of relatively shorter time periods may be advantageously applied to prevent copper corrosion while removing a remaining portion of excess copper overlying the adhesion/barrier layer in the copper overpolishing step.

Figure 2C:
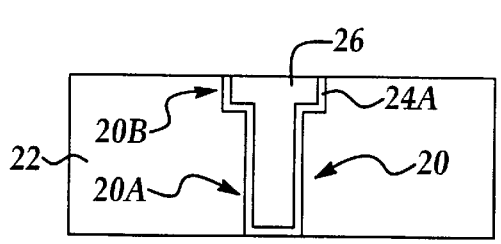

In another embodiment of the present invention, following the copper overpolishing step (second CMP process), a third CMP process is performed including alternately applying a barrier polishing slurry and a copper corrosion inhibitor to contact the semiconductor wafer polishing surface to substantially remove the adhesion/barrier layer, for example, tantalum nitride, overlying the ILD layer as conceptually shown in FIG. 2C. For example, in the third CMP process the barrier polishing slurry preferably includes an ILD layer polishing inhibitor, for example ethylene-diamine-tetra-acetic acid. In addition, a complexing agent such as a carboxylic acid may be used to accelerate the barrier/adhesion layer removal rate. It will be appreciated that any conventional slurry including commercially available slurries may be used as the barrier polishing slurry. According to one embodiment of the present invention, the copper corrosion inhibitor preferably includes at least one of Benzotriazole (BTA), and Benzotriazole derivatives such as Triazole, and Tritriazole. BTA is preferred as it has been found to be the most effective. The copper corrosion inhibitor preferably includes a mixture of BTA and deionized water including a concentration of BTA at from about 0.04 wt % to about 4 wt %.

Figure 2D:
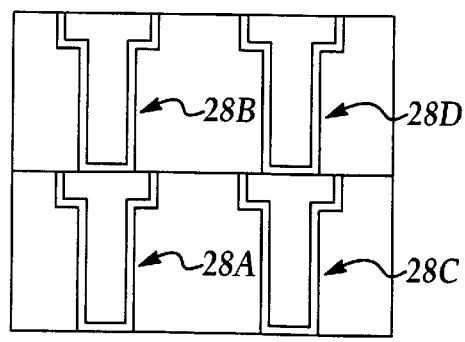

Similar to the second CMP process, the third CMP process includes at least one application of the copper corrosion inhibitor to contact the semiconductor wafer polishing surface for a period of time during the third CMP process. For example, after a CMP process for a period of time performed while applying the barrier polishing slurry to contact the semiconductor wafer polishing surface, the application of the barrier polishing slurry is stopped and the copper corrosion inhibitor is applied to contact the semiconductor wafer polishing surface during a CMP process for a period of time to complete a polishing cycle included in the third CMP process. In the third CMP process, in a preferred embodiment, the barrier polishing slurry is applied to the semiconductor wafer polishing surface at a flow rate of from about 100 ml/min to about 500 ml/min for about 30 to about 60 seconds after which the application of the barrier polishing slurry is stopped and the corrosion inhibitor is applied at a flow rate of from about 100 ml/min to about 500 ml/min for about 5 to about 20 seconds during the CMP process to complete a polishing cycle included in the third CMP process. The polishing cycle of alternately independently applying the barrier polishing slurry and the copper corrosion inhibitor in the third CMP process is preferably repeated from about 1 to about 4 times to complete the third CMP process. For example, the tantalum removal rate is typically at least 400 Angstroms/min. Following the third CMP process a conventional oxide buffing process is typically carried out to complete a CMP planarization process. Referring to FIG. 2D is shown a side view representation of an idealized series of stacked dual damascene structures, e.g., 28A, 28B, 28C and 28D following manufacture including a CMP process according to the present invention. The copper corrosion according to CMP processes of the prior art are prevented providing fully filled copper interconnects for continuous electrical communication.

Figure 3:
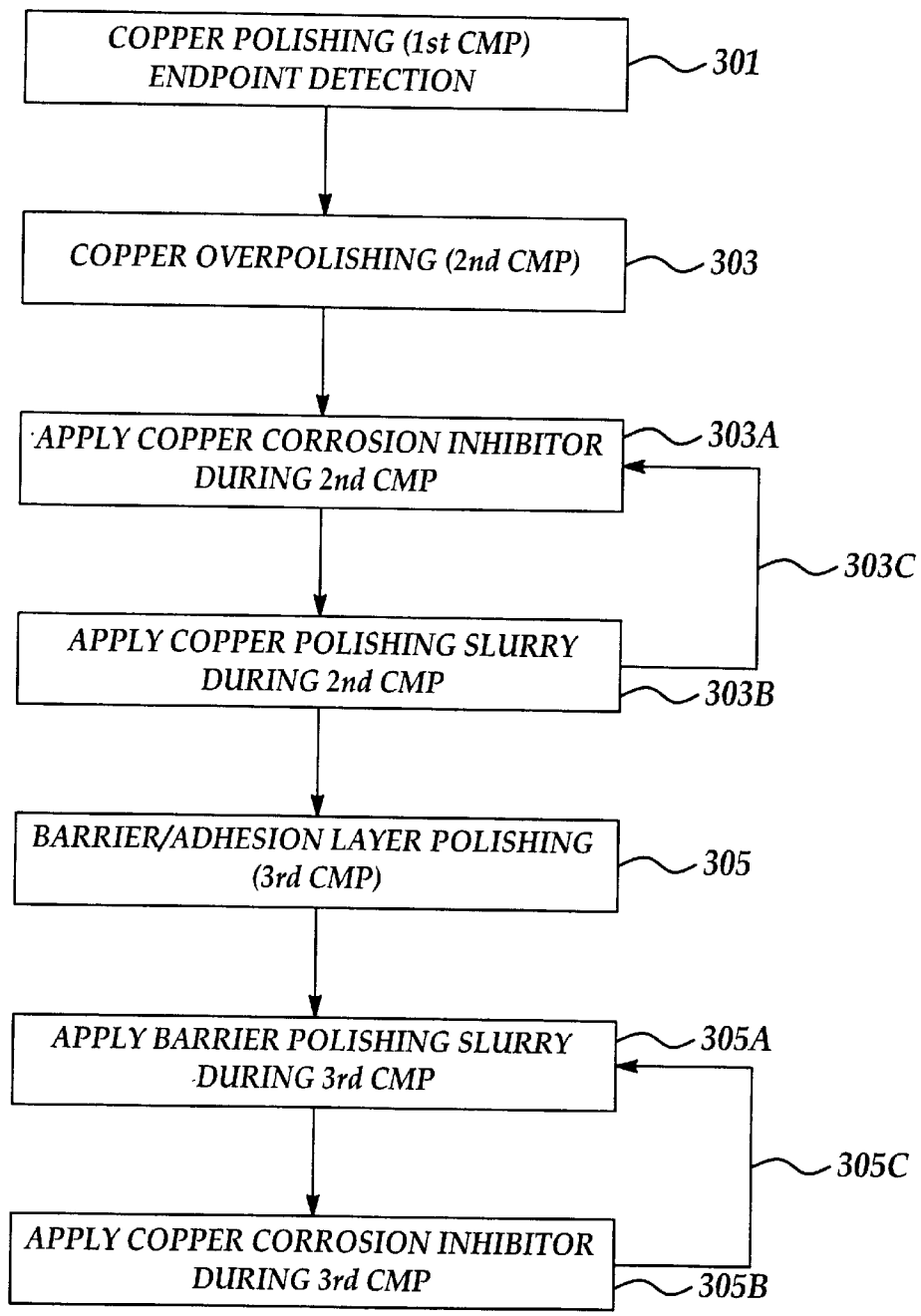
FIG. 3 depicts a process flow diagram including several embodiments of the present invention.

Referring to FIG. 3, several of the embodiments of the present invention are shown. In a first process, 301, a first CMP process using a first polishing slurry is carried out to endpoint detection to substantially remove an uppermost layer of the semiconductor wafer polishing surface, for example copper. In this process, a portion of an underlying layer, for example, a barrier/adhesion layer is exposed. In a second CMP process 303 including process 303A and 303B a copper corrosion inhibitor is applied to contact the wafer polishing surface for a period of time (process 303A) followed by application of the copper polishing slurry to contact the wafer polishing surface for a period of time (process 303B) to comprise of copper overpolishing cycle. The overpolishing cycle of process 303A and 303B is performed at least once and may optionally be repeated as indicated by directional process arrow 303C. A third CMP process similar to the second CMP process comprising a barrier/adhesion layer polishing process 305 including process 305A and 305B is carried out with a second polishing slurry alternately applied to contact the semiconductor wafer polishing surface to substantially remove an underlying barrier/adhesion layer. In the third CMP process 305 a barrier polishing slurry is applied to contact the wafer polishing surface for a period of time (process 305A) followed by application of a copper corrosion inhibitor (process 305B) to contact the wafer polishing surface for a period of time to complete a polishing cycle in the third CMP process 305. In the third CMP process 305 the polishing cycle including process 305A and 305B is preferably repeated from about 1 to about 4 times as indicated by directional process arrow 305C. It will be appreciated that the same copper corrosion inhibitor, for example a BTA/deionized water solution, may be used or a different solution may be used, for example, having a different concentration.

It will be appreciated that the first second and third CMP process may use a combination of polishing pads and platens. For example, the first and third CMP process may be carried out on separate polishing platens including separate polishing pads with the second CMP polishing process carried out on the same polishing platen as the first CMP process. It will further be appreciated that the first, second, and third CMP process may be carried out on the same polishing platen with one polishing pad with the polishing slurries and copper corrosion inhibitor applied through the same or different flow nozzles. It will additionally be appreciated that the polishing slurries and copper corrosion inhibitor may be applied in various ways to the semiconductor polishing surface including, for example, through solution delivery systems built into the polishing platen and polishing pad as is known in the art.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for preventing or reducing corrosion of copper containing features included in a semiconductor wafer in a chemical mechanical polishing (CMP) process comprising the steps of:

provinding a semiconductor wafer polishing surface including copper filled anisotropically etched features;

polishing the semiconductor wafer polishing surface according to a first CMP process including applying at least one polishing slurry to contact the semiconductor wafer polishing surface for removing an uppermost layer of the semiconductor wafer polishing surface; and, alternately applying a copper corrosion inhibitor solution for a period of time and the at least one polishing slurry for a period of time to contact the semiconductor wafer polishing surface to comprise a polishing cycle said polishing cycle performed at least once during at least a second CMP process.

2. The method of claim 1, wherein the step of polishing the semiconductor wafer polishing surface according to a first CMP process includes polishing the uppermost layer to endpoint detection with respect to the uppermost layer.

3. The method of claim 2, wherein the uppermost layer includes copper.

4. The method of claim 1, wherein the copper corrosion inhibitor solution includes Benzotriazole (BTA) and derivatives thereof.

5. The method of claim 4, wherein the copper corrosion inhibitor solution includes a mixture of BTA and deionized water.

6. The method of claim 5, wherein the BTA is present in an amount from about 0.04 to about 4 weight percent.

7. The method of claim 1, wherein the step of alternately applying includes applying the copper corrosion inhibitor solution from about 5 to about 20 seconds and applying the polishing slurry from about 30 to about 60 seconds.

8. The method of claim 1, wherein the at least a second CMP process includes a third CMP process to remove a barrier/adhesion layer underlying the uppermost layer to planarize the semiconductor wafer polishing surface.

9. The method of claim 8, wherein the barrier/adhesion layer comprises a metal nitride.

10. The method of claim 9, wherein the metal nitride includes at least one of titanium nitride and tantalum nitride.

11. The method of claim 10, wherein the polishing cycle is performed from about 1 to about 4 times.

12. A method for preventing or reducing corrosion of copper containing features included in a semiconductor wafer during chemical mechanical polishing (CMP) comprising the steps of:

providing a semiconductor wafer polishing surface including copper filled anisotropically etched features;

polishing the semiconductor wafer polishing surface according to a first CMP process including applying a first polishing slurry for removing an uppermost copper layer of the semiconductor wafer polishing surface to endpoint detection with respect to the uppermost copper layer;

alternately applying to the semiconductor wafer polishing surface a first copper corrosion inhibitor solution for a period of time and the first polishing slurry for a period of time to comprise a copper layer overpolishing cycle said copper layer overpolishing cycle performed at least once during a second CMP process to substantially expose an underlying barrier/adhesion layer; and alternately applying to the semiconductor wafer polishing surface a second polishing slurry for a period of time and the second copper corrosion inhibitor solution for a period of time to comprise a barrier/adhesion layer polishing cycle said polishing cycle performed at least once during a third CMP process to substantially expose an underlying insulating layer.

13. The method of claim 12, wherein at least one of the first and second copper corrosion inhibitor solutions include Benzotriazole (BTA) and derivatives thereof.

14. The method of claim 13, wherein at least one of the first and second copper corrosion inhibitor solutions includes a mixture of BTA and deionized water.

15. The method of claim 14, wherein the BTA is present in an amount from about 0.04 to about 4 weight percent.

16. The method of claim 12, wherein the steps of alternately applying include independently applying the first copper corrosion inhibitor solution from about 5 to about 20 seconds and independently applying the first polishing slurry from about 30 to about 60 seconds.

17. The method of claim 12, wherein the steps of alternately applying include independently applying the second copper corrosion inhibitor solution from about 5 to about 20 seconds and independently applying the second polishing slurry from about 30 to about 60 seconds.

18. The method of claim 12, wherein the barrier/adhesion layer comprises a metal nitride.

19. The method of claim 18, wherein the metal nitride includes at least one of titanium nitride and tantalum nitride.

20. The method of claim 12, wherein the barrier/adhesion layer polishing cycle is performed from about 1 to about 4 times.

* * * * *